United States Patent [19]
Nakama et al.

[11] Patent Number: 5,406,142
[45] Date of Patent: Apr. 11, 1995

[54] LEVEL SHIFTING LOW TO HIGH SUPPLY VOLTAGE INTERFACE CIRCUIT

[75] Inventors: Junichi Nakama, Ooita; Hiroshi Yoshida; Takanori Seino, both of Yokohama, all of Japan

[73] Assignee: Kabushiki Kaisha Toshiba, Kawasaki, Japan

[21] Appl. No.: 141,544

[22] Filed: Oct. 27, 1993

[30] Foreign Application Priority Data

Oct. 27, 1992 [JP] Japan .................................. 4-288929

[51] Int. Cl.⁶ ................ H03K 19/0175; H03K 19/094
[52] U.S. Cl. ........................................ 326/68; 326/121
[58] Field of Search ............................... 307/475, 451

[56] References Cited
U.S. PATENT DOCUMENTS

| | | | |
|---|---|---|---|
| 4,897,567 | 1/1990 | Bacrania | 307/451 |
| 4,998,028 | 3/1991 | Chappell et al. | 307/451 |
| 5,115,434 | 5/1992 | Aizaki | 307/451 |
| 5,136,190 | 8/1992 | Chern et al. | 307/451 |
| 5,204,557 | 4/1993 | Nguyen | 307/451 |

Primary Examiner—Edward P. Westin
Assistant Examiner—Richard Roseen
Attorney, Agent, or Firm—Oblon, Spivak, McClelland, Maier & Neustadt

[57] ABSTRACT

When the input signal IN1 changes from a ground voltage GND to a first voltage -E1 and from the first voltage -E1 to the ground voltage GND, the output potential of the -E2 system flip-flop circuit changes gradually. The inverted signal from the -E1 system inverter circuit is supplied to the -E2 system inverter circuit earlier than the output signal (high-potential signal) of the -E2 system flip-flop circuit. This eliminates a period of time when all the MOSFETs in the -E2 system inverter circuit turn on simultaneously, thereby reducing a through current in the -E2 system inverter circuit. Consequently, the circuit operation can be stabilized by decreasing through currents flowing in the -E1 system inverter circuit and the -E2 system inverter circuit using the output signal of the -E2 system flip-flop circuit as an input.

8 Claims, 7 Drawing Sheets

LEVEL SHIFTING LOW TO HIGH SUPPLY VOLTAGE INTERFACE CIRCUIT

BACKGROUND OF THE INVENTION

1. Field of the Invention

The present invention relates to a semiconductor integrated circuit with a level shifter circuit and, more particularly, to a semiconductor integrated circuit used to decrease a through current in an inverter circuit which uses an output signal of the level shifter circuit as an input signal.

2. Description of the Related Art

Figure 1:
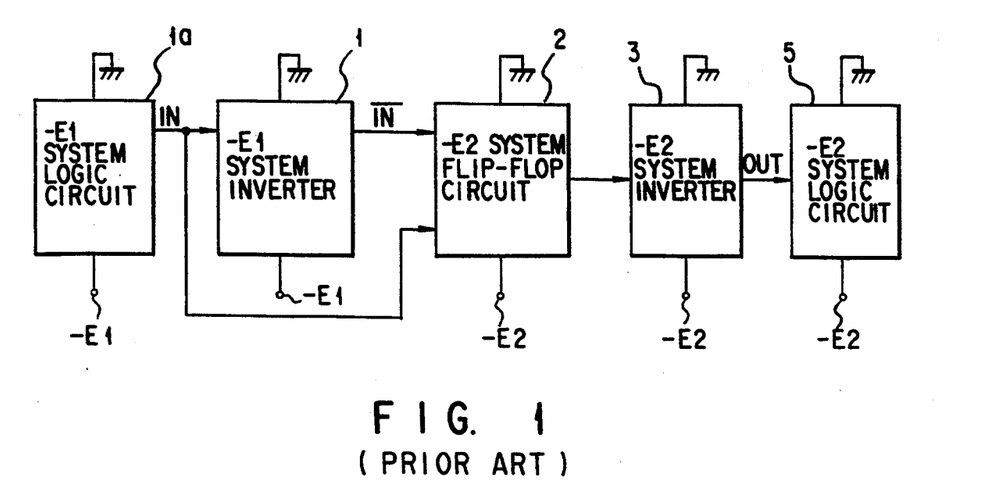
FIG. 1 is a block diagram of a conventional interface circuit.

FIG. 1 is a block diagram of a conventional interface circuit between a low-voltage system (referred to as a -E1 system hereinafter) and a high-voltage system (referred to as a -E2 system hereinafter). The interface shown in FIG. 1 is connected between a -E1 system logic circuit 1a and a -E2 system logic circuit 5, and comprises a -E1 system inverter circuit 1, a -E2 system flip-flop circuit 2, and a -E2 system inverter circuit 3. The -E1 system inverter circuit 1 and the -E2 system flip-flop circuit 2 constitute a voltage conversion circuit (level shifter circuit). The -E1 system logic circuit 1a outputs a digital input signal IN alternating between the ground voltage GND and a first voltage (first power supply voltage) -E1 (low voltage). The -E1 system inverter circuit 1 receives the input signal IN and outputs a signal $\overline{\text{IN}}$ (the inversion signal of signal IN). The -E2 system flip-flop circuit 2 uses the input signal IN and the output signal e,ovs/IN/ of the -E1 system inverter circuit 1 as input signals, and is connected between the ground voltage GND and a second voltage (second power supply voltage) -E2 (high voltage). The -E2 system inverter circuit 3 waveform-shapes the output signal of the level shifter circuit or the output signal of the -E2 system flip-flop circuit 2, and supplies the shaped signal as the input signal to the -E2 system logic circuit 5.

Figure 2:
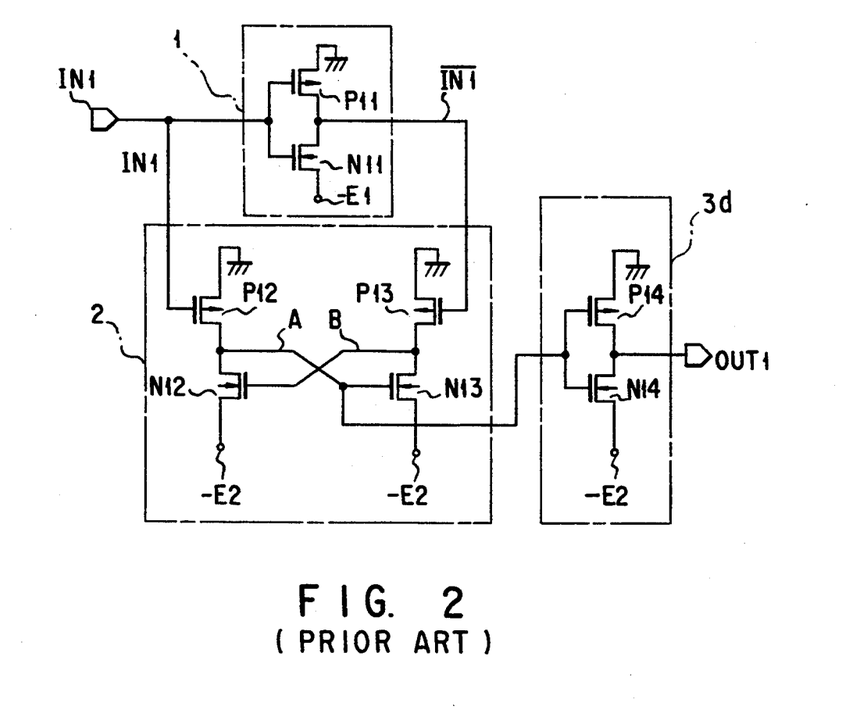
FIG. 2 is a circuit diagram of a first conventional interface circuit.

FIG. 2 shows a concrete arrangement of the interface circuit of FIG. 1, which is composed of complementary MOSFETs formed on an N-type semiconductor substrate. The -E1 system logic circuit 1a and -E2 system logic circuit 5 of FIG. 1 are not shown in FIG. 2. The -E1 system inverter circuit 1 is composed of a P-channel MOSFET P11 and an N-channel MOSFET N11. The gate of each of the P-channel MOSFET P11 and N-channel MOSFET N11 is supplied with the input signal IN1. One end of the current path of the P-channel MOSFET P11 is grounded and the other end is connected to one end of the current path of the N-channel MOSFET N11. The other end of the N-channel MOSFET N11 is supplied with the first voltage -E1. The output terminal of the -E1 system inverter circuit 1 supplies the inverted signal $\overline{\text{IN1}}$. The -E2 system flip-flop circuit 2 is composed of P-channel MOSFETs P12 and P13 and N-channel MOSFETs N12 and N13, and uses the input signal IN1 and the inverted signal $\overline{\text{IN1}}$ as input signals and outputs a signal alternating between the ground voltage GND and the second voltage -E2. The -E2 system flip-flop circuit 2 outputs a signal of opposite phase to the input signal IN1. Specifically, the flip-flop circuit 2 outputs a signal at the level of the second voltage -E2 when the input signal IN1 is at the level of the ground voltage GND, and outputs a signal at the ground voltage GND when the input signal IN1 is at the first voltage -E1. The gate electrodes of the P-channel MOSFETs P12 and P13 are supplied with the input signal IN1 and the inverted signal $\overline{\text{IN1}}$, respectively. One ends of the current paths of the P-channel MOSFETs 12 and 13 are grounded, respectively. The other end of the current path of the P-channel MOSFET P12 is connected to one end of the current path of the N-channel MOSFET N12. This connection point is connected to the gate electrode of the N-channel MOSFET N13 and the input terminal of the -E2 system inverter circuit 3d. The other end of the current path of the P-channel MOSFET P13 is connected to one end of the current path of the N-channel MOSFET N13. This connection point is connected to the gate electrode of the N-channel MOSFET N12. The other ends of the current paths of the N-channel MOSFETs N12 and N13 are supplied with the second voltage -E2. To stabilize the circuit operation, the amplification factors of the P-channel MOSFETs P12 and P13 and the N-channel MOSFETs N12 and N13 constituting the -E2 system flip-flop circuit 2 are set as follows: $gm_{p12} > gm_{N12}$, $gm_{p13} > gm_{N13}$, $gm_{p12} = gm_{p13}$, and $gm_{N12} = gm_{N13}$. Where $gm_{p12}$ is the amplification factor of the P-channel MOSFET P12, and $gm_{N12}$, $gm_{p13}$, and $gm_{N13}$ indicate the amplification factors of the corresponding MOSFETs. The -E2 system inverter circuit 3d is composed of a P-channel MOSFET P14 and an N-channel MOSFET N14. One end of the current path of the P-channel MOSFET P14 is grounded and the other end is connected to one end of the current path of the N-channel MOSFET N14, the other end of which is supplied with the second voltage -E2. The connection of the gate electrodes of the P-channel MOSFET P14 and the N-channel MOSFET N14 is the input terminal of the -E2 system inverter circuit 3d. The connection of the other end of the current path of the P-channel MOSFET P14 and one end of the current path of the N-channel MOSFET N14 is the output terminal of the -E2 system inverter circuit 3d. At the output terminal, an output signal OUT1 is supplied.

Figure 3:
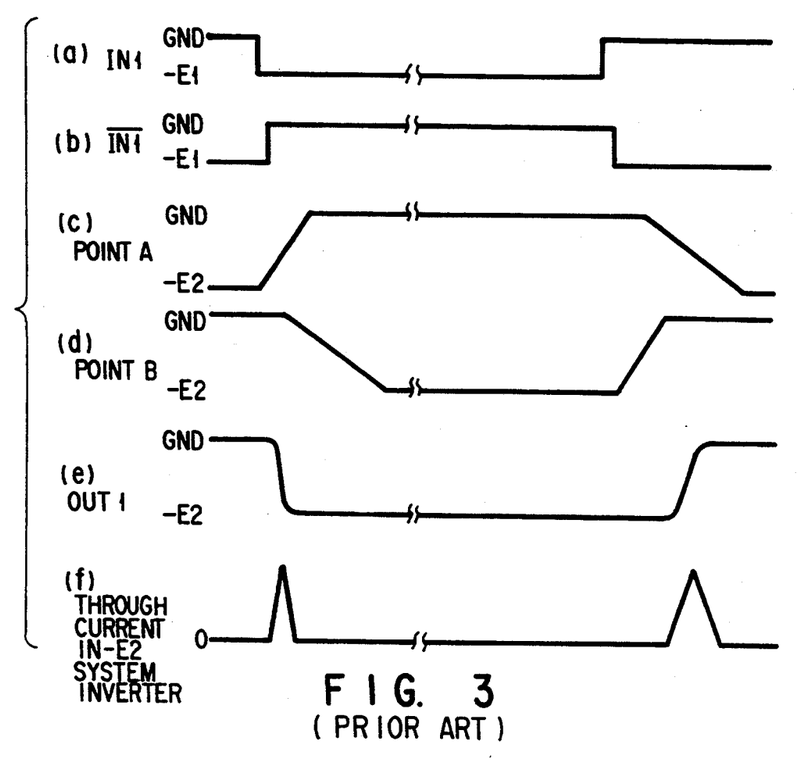
FIG. 3 is a timing chart for the operation of the first conventional interface circuit of FIG. 2.

FIG. 3 is a timing chart for the operation of the interface circuit of FIG. 2. The operation of the interface circuit will be explained when the input signal IN1 changes from the ground voltage GND (high level) to the first voltage -El (low level), as shown in FIG. 3(a). As shown in FIG. 3(a), when the input signal IN1 is at the ground voltage GND, the inverted signal $\overline{\text{IN1}}$ is at the first voltage -El as shown in FIG. 3(b). A point A is at the second voltage -E2, a point B is at the ground voltage GND, and the output signal OUT1 is at the ground voltage GND, as shown in FIGS. 3(c) through (e). In this state, as shown in FIG. 3(c), the potential at the point A equals the second voltage -E2, the N-channel MOSFET N13 is off and the point B remains at the ground voltage GND. In this state, since the N-channel MOSFET N14 is off, a through current does not flow in the P-channel MOSFET P14 and N-channel MOSFET N14. In this state, when the potential of the input signal IN1 changes to the first voltage -E1 as shown in FIG. 3(a), the potential of the inverted signal $\overline{\text{IN1}}$ goes to the ground voltage GND, causing the P-channel MOSFET P12 to turn on and the P-channel MOSFET P13 to turn off. Therefore, the potential of the point A corresponds to the resistance division ratio (voltage division ratio) of the P-channel MOSFET P12 and the N-channel MOSFET N12. According to the relationship between the amplification factor $gm_{p12}$ of the P-channel MOSFET P12 and the amplification factor $gm_{N12}$ of the N-channel MOSFET N12, the potential of the point A changes gradually from the second voltage -E2 to the ground voltage GND, as shown in FIG. 3(c). On the other hand, the change of the potential at the point A places the N-channel MOSFET N13 in an ON state and the potential at the point B changes from the ground voltage GND to the second voltage -E2, as shown in FIG. 3(d). As a result, the N-channel MOSFET N12 goes to the OFF state and the potential at the point A changes from the second voltage -E2 to the ground voltage GND. In this way, because the potential at the point A is determined by the resistance division between of the p-channel MOSFET P12 and N-channel MOSFET N12 and the interaction with the potential of the point B, it changes gradually without a normal CMOS operation which is seen in the -E1 system inverter circuit 1. As describe above, in accordance with the potential at the point A changing from the second voltage -E2 to the ground voltage GND, the P-channel MOSFET P14 turns off and the N-channel MOSFET N14 turns on. This causes the potential of the output signal OUT1 to change from the ground voltage GND to the second voltage -E2.

Then, the operation of the interface circuit will be explained when the input signal IN1 changes from the first voltage -E1 to the ground voltage GND, as shown in FIG. 3(a). When the input signal IN1 is at the first voltage -E1, the inverted signal IN1 is at the ground voltage GND, the point A is at the ground voltage GND, the point B is at the second voltage -E2, and the output signal OUT1 is at the second voltage -E2. In this state, because the point A is at the ground voltage GND, the P-channel MOSFET P14 turns off, with the result that a through current does not flow in the -E2 system inverter circuit 3. In this case, when the input signal IN1 changes to the ground voltage GND, the inverted signal IN1 goes to the first voltage -E1. This causes the P-channel MOSFET P12 to turn off and the P-channel MOSFET P13 to turn on. As a result, the potential at the point B corresponds to the resistance division ratio of the P-channel MOSFET P13 to the N-channel MOSFET N13. According to the relationship of $gm_{P13} > gm_{N13}$, the potential at the point B gradually changes from the second voltage -E2 to the ground voltage GND. On the other hand, the change of the potential at the point B causes the N-channel MOSFET N12 to turn on. The potential at the point A thus changes to the second voltage -E2. The change of the potential at the point A causes the N-channel MOSFET N13 to go to the OFF state. Therefore, the potential at the point B finally equals the ground voltage GND and the potential at the point A goes to the second voltage -E2. In this way, since the potential at the point A is determined by the resistance division between the P-channel MOSFET P13 and N-channel MOSFET N13 and the interaction with the potential of the point B, it changes gradually without a normal CMOS operation, as seen in the -1 system inverter circuit 1. The second voltage -E2 at the point A is supplied to the gate electrodes of the P-channel MOSFET P14 and the N-channel MOSFET N14. This causes the P-channel MOSFET P14 to turn on and the N-channel MOSFET N14 to turn off, placing the potential of the output signal OUT1 at the ground voltage GND.

Figure 4:
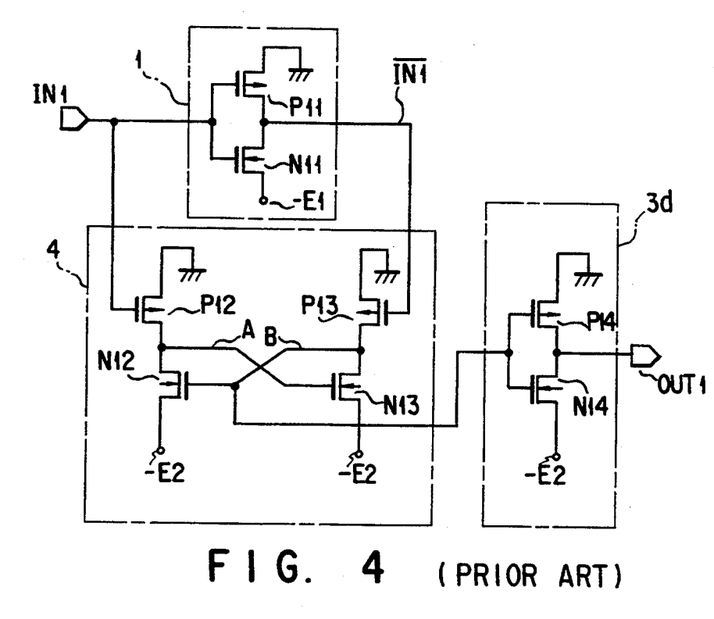
FIG. 4 is a circuit diagram of a second conventional interface circuit.

FIG. 4 shows a second conventional interface circuit. The interface circuit of FIG. 4 differs from that of FIG. 2 in the following points. In FIG. 2, the input terminal of the -E2 system inverted circuit 3d is connected to the gate electrode of the N-channel MOSFET N13 and the connection of the other end of the current path of the P-channel MOSFET P12 and one end of the current path of the N-channel MOSFET N12. In contrast, the input terminal of the -E2 system inverted circuit 3d of FIG. 4 is connected to the gate electrode of the N-channel MOSFET N12 and the connection of the other end of the current path of the P-channel MOSFET P13 and one end of the current path of the N-channel MOSFET N13. The remaining parts of the interface circuit of FIG. 4 is the same as that of FIG. 2, so that the same parts as those in FIG. 2 are indicated by the same reference characters and their explanation will be omitted. Further, the interface circuit of FIG. 4 differs from that of FIG. 2 in that the former supplies the output signal of an opposite phase to the input signal IN1. Specifically, in the interface circuit of FIG. 4, the output signal of the -E2 system inverter circuit 3d equals the second voltage -E2 when the input signal IN1 is at the ground voltage GND, and the same output signal goes to the ground voltage GND when the input signal IN1 is at the first voltage -E1. Therefore, the inverted signal IN1 and the potentials at points A and B change as shown in FIGS. 3(b) through (d).

However, when the input signal IN1 changes from the ground voltage GND to the first voltage -E1 as in the first conventional example, the potential at the point B changes gradually, and the -E2 system flip-flop circuit does not perform a normal CMOS operation and changes gradually. This causes a period of time when the P-channel MOSFET P14 and N-channel MOSFET N14 turn on simultaneously, permitting a through current to flow through the -E2 system inverter circuit 3 between the ground voltage GND and the second voltage -E2. Further, when the input signal IN1 changes from the first voltage -E1 to the ground voltage GND, the potential at the point A does not perform a normal CMOS operation and changes gradually. This causes a period of time when the P-channel MOSFET P14 and N-channel MOSFET N14 of the -E2 system inverter circuit turn on simultaneously, permitting the through current to flow between the ground voltage GND and the second voltage -E2.

SUMMARY OF THE INVENTION

Accordingly, an object of the present invention is to provide an interface circuit capable of preventing the simultaneous turning on of all the transistors of a first conductivity type and of a second conductivity type constituting a second inverter circuit and consequently reducing a through current in the second inverter circuit, by supplying the inverted signal from a first inverter circuit to the second inverter circuit earlier than a high-voltage signal from a high-potential-system power supply flip-flop circuit.

Another object of the present invention is to provide an interface circuit capable of preventing the simultaneous turning on of all the transistors of a first conductivity type and of a second conductivity type constituting a second inverter circuit and consequently reducing a through current in the second inverter circuit, by supplying a low-potential signal to the second inverter circuit earlier than a high-voltage signal from a high-potential-system power supply flip-flop circuit.

According to an aspect of the present invention, there is provided an interface circuit comprising: an output circuit for outputting a low-potential signal; a first inverter circuit, connected between a low-potential power supply and a ground potential power supply, for inverting the low-potential signal input from the output circuit and outputting a low-potential inverted signal; a high-potential system power supply flip-flop circuit, connected between a high-potential power supply and the ground potential power supply, for outputting a high-potential signal having an opposite phase to the low-potential signal with a predetermined transition time by using the low-potential signal input from the output circuit and the low-potential inverted signal input from the first inverter circuit; and a second inverter circuit including a first transistor of a first conductivity-type, a first transistor of a second conductivity-type and at least one second transistor of either conductivity-type, and for outputting a high-potential signal having an opposite phase to the high-potential signal output from the high-potential system power supply flip-flop circuit from a connection point as an output terminal between the first transistor of the first conductivity-type and the first transistor of the second conductivity-type by using the low-potential inverted signal of the first inverter circuit which is input to a gate of the second transistor of either conductivity-type and the high-potential signal having the opposite phase which is input to gates of the first transistors of the first and the second conductivity-type.

According to another aspect of the present invention, there is provided an interface circuit comprising: an output circuit for outputting a low-potential signal; a first inverter circuit, connected between a low-potential power supply and a ground potential power supply, for inverting the low-potential signal input from the output circuit and outputting a low-potential inverted signal; a high-potential system power supply flip-flop circuit, connected between a high-potential power supply and the ground potential power supply, for outputting a high-potential signal having a same phase as the low-potential signal with a predetermined transition time by using the low-potential signal input from the output circuit and the low-potential inverted signal input from the first inverter circuit; and a second inverter circuit including a first transistor of a first conductivity-type a first transistor of a second conductivity-type and at least one second transistor of either conductivity-type, and for outputting a high-potential signal having an opposite phase to the high-potential signal output from the high-potential system power supply flip-flop circuit from a connection point as an output terminal between the first transistor of the first conductivity-type and the first transistor of the second conductivity-type by using the low-potential signal of the output circuit which is input to a gate of the second transistor of either conductivity-type and the high-potential signal having the same phase which is input to gates of the first transistors of the first and the second conductivity-type.

In the present invention, firstly, the power supply flip-flop circuit of the high-potential system receives the low-potential signal and the inverted signal from the first inverter circuit, and supplies a high-potential signal of an opposite phase to the low-potential signal. The second inverter circuit is supplied with the inverted signal from the first inverted circuit. In this case, since the inverted signal from the first inverter circuit is supplied earlier than the high-potential signal from the power supply flip-flop circuit of the high-potential system, all the transistors of a first conductivity type and of a second conductivity type constituting the second inverter circuit can be prevented from being turned on simultaneously. Consequently, a through current in the second inverter circuit can be reduced. Secondly, the power supply flip-flop circuit of the high-potential system receives the low-potential signal and the inverted signal from the first inverter circuit, and supplies a high-potential signal of the same phase with the low-potential signal. The second inverter circuit is supplied with a low-potential signal. In this case, since the low-potential signal is supplied earlier than the high-potential signal from the power supply flip-flop circuit of the high-potential system, all the transistors of a first conductivity type and of a second conductivity type constituting the second inverter circuit can be prevented from being turned on simultaneously. As a result, a through current in the second inverter circuit can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be explained in detail hereinafter with reference to the accompanying drawings.

Figure 5:
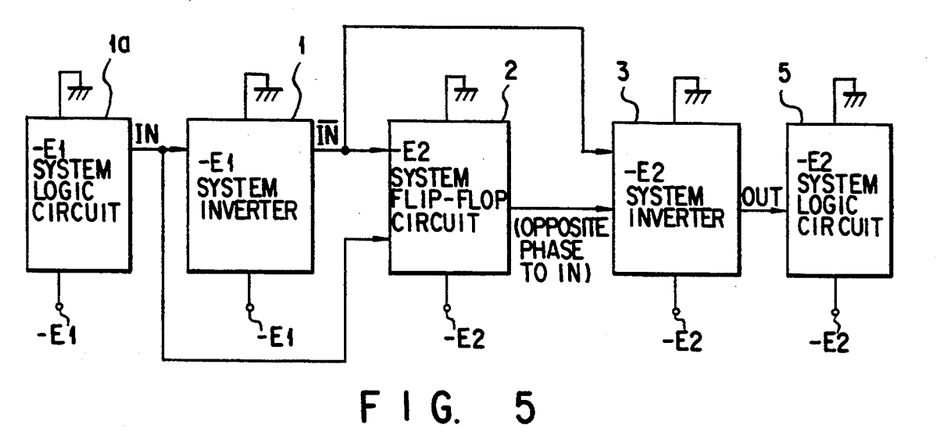
FIG. 5 is a schematic block diagram of an interface circuit of the present invention.

FIG. 5 is a schematic block diagram of an interface circuit used between a -E1 system (a low-voltage system) to a -E2 system (a high-voltage system). The interface circuit of FIG. 5 is connected between a -E1 system logic circuit 1a and a -E2 system logic circuit 5, and comprises a -E1 system inverter circuit 1, a -E2 system flip-flop circuit 2, and a -E2 system inverter circuit 3. The output signal of the -E1 system logic circuit 1a is supplied to the -E1 system inverter circuit 1 and a second input terminal of the -E2 system flip-flop circuit 2. The output signal of the -E1 system inverter circuit 1 is supplied to a first input terminal of the -E2 system flip-flop circuit and a first input terminal of the -E2 system inverter circuit 3. The output signal of the -E2 system flip-flop circuit 2 having an opposite phase to the input signal IN is supplied to a second input terminal of the -E2 system inverter circuit 3, inverted and waveform-shaped therein, and then supplied to the -E2 system logic circuit 5. A ground voltage GND is supplied to each of the -E1 system logic circuit 1a, -E1 system inverter circuit 1, -E2 system flip-flop circuit 2, -E2 system inverter circuit 3, and -E2 system logic circuit 5. A first voltage -E1 is supplied to the -E1 system logic circuit 1a and the -E1 system inverter circuit 1. A second voltage -E2 is supplied to the -E2 system flip-flop circuit 2, the -E2 system inverter circuit 3, and the -E2 system logic circuit 5. The interface circuit of FIG. 5 differs from the conventional interface circuit of FIG. 1 in that the output signal of the level shifter (the -E2 system flip-flop circuit) and that of the -E1 system inverter circuit are supplied as input signals to the -E2 system inverter circuit (the -E2 system inverter circuit) 3.

Figure 6:
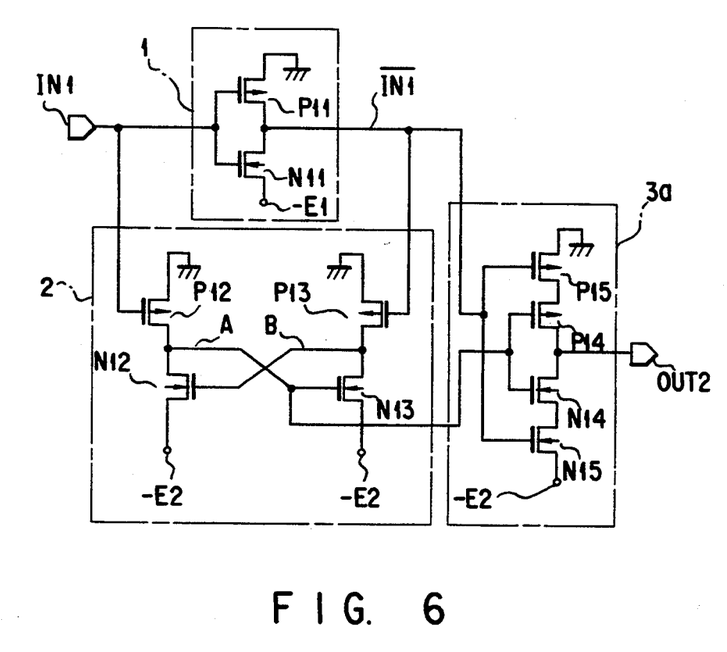
FIG. 6 is a circuit diagram of an interface circuit according to a first embodiment of the present invention.

FIG. 6 is a circuit diagram of an interface circuit according to a first embodiment of the present invention. Referring to FIG. 6, a concrete arrangement of the interface circuit will be described. The -E1 system inverter circuit 1 of FIG. 6 is composed of a P-channel MOSFET P11 and an N-channel MOSFET N11, inverts the input signal IN1 and outputs the inverted signal IN1. One end of the current path of the P-channel MOSFET P11 is supplied with the ground voltage GND. The other end of the current path of the N-channel MOSFET N11 is supplied with the first voltage -E1. The connection of the gate electrode of the P-channel MOSFET P11 and that of the N-channel MOSFET N11 is the input terminal of the -E1 system inverter circuit t. The other end of the P-channel MOSFET P11 and one end of the current path of the N-channel MOSFET N11 is connected to each other to form the output terminal of the -E1 system inverter circuit 1. The -E2 system flip-flop circuit 2 comprises a P-channel MOSFET P12, an N-channel MOSFET N12, a P-channel MOSFET P13, and an N-channel MOSFET N13. The gate electrode of the P-channel MOSFET P12 is supplied with the input signal IN1, one end of the current path of which is supplied with the ground voltage GND. The other end of the current path of the P-channel MOSFET P12 is connected to one end of the current path of the N-channel MOSFET N12. This connection point is connected to the gate electrode of the N-channel MOSFET N13 explained later. The output at the connection of the other end of the current path of the P-channel MOSFET P12 and one end of the current path of the N-channel MOSFET N12 is the output signal of the -E2 system flip-flop 2. The other end of the current path of the N-channel MOSFET N12 is supplied with the second voltage -E2. One end of the current path of the P-channel MOSFET P13 is supplied with the ground voltage GND. The other end of the current path of the P-channel MOSFET P13 is connected to one end of the current path of the N-channel MOSFET N13. This connection point is connected to the gate electrode of the N-channel MOSFET N12. The gate electrode of the P-channel MOSFET P13 is supplied with the inverted signal IN1 of the -E1 system inverter circuit 1. The other end of the current path of the N-channel MOSFET N13 is supplied with the second voltage -E2. The -E2 system inverter circuit 3a comprises P-channel MOSFETs P14 and P15 and N-channel MOSFETs N14 and N15, and receives the inverted signal IN1 and the output signal of the -E2 system flip-flop circuit 2 and produces an output signal OUT2. One end of the current path of the P-channel MOSFET P15 is supplied with the ground voltage GND, the gate electrode of which is supplied with the inverted signal IN1. The other end of the current path of the P-channel MOSFET P15 is connected to one end of the current path of the P-channel MOSFET P14. The gate electrode of the P-channel MOSFET P14 is supplied with the output signal of the -E2 system flip-flop circuit 2. The other end of the current path of the P-channel MOSFET P14 is connected to one end of the current path of the N-channel MOSFET N14. The output at this connection point is the output signal of the -E2 system inverter circuit 3a. The gate electrode of the N-channel MOSFET N14 is supplied with the output signal of the -E2 system flip-flop circuit 2. The other end of the current path of the N-channel MOSFET N14 is connected to one end of the current path of the N-channel MOSFET N15. The gate electrode of the N-channel MOSFET N15 is supplied with the inverted signal IN1. The other end of the current path of the N-channel MOSFET N15 is supplied with the second voltage -E2.

Now, referring to the timing chart of FIG. 7, the operation of the interface circuit of FIG. 6 will be described. First, a case where the input signal IN1 changes from the ground voltage GND to the first voltage -E1, as shown in FIG. 7(a), will be explained. When the input signal IN1 is at the ground voltage GND as shown in FIG. 7(a), the inverted signal IN1 is at the first voltage -E1 (FIG. 3(b)). Further, the point A is at the second voltage -E2 as shown in FIG. 3(c) and the point B is at the ground voltage GND as shown in FIG. 3(d). Still further, the P-channel MOSFET P14 is ON, the N-channel MOSFET N14 is OFF, the P-channel MOSFET P15 is ON, the N-channel MOSFET N15 is ON with a high resistance, and the output signal OUT2 is at the ground voltage GND as shown in FIG. 3(e).

Then, when the input signal IN1 changes from the ground voltage GND to the first voltage -E1, as shown in FIG. 3(a), the gate electrode of the P-channel MOSFET P12 is supplied with the input signal IN1 of the first voltage -E1, causing the P-channel MOSFET P12 to turn on. The inverted signal IN1 goes to the ground voltage GND, causing the P-channel MOSFET P15 to turn off and the N-channel MOSFET N15 to turn on, and the P-channel MOSFET P13 to turn off. The potential at the point A start to change toward the ground voltage GND. The gate electrode of the N-channel MOSFET N13 is supplied with a signal of the ground voltage GND, causing the N-channel MOSFET N13 to turn on. The potential at the point B is finally placed at the second voltage -E2. Receiving the second voltage -E2, the N-channel MOSFET N12 turns off, causing the potential at point A to go to the ground voltage GND. When the output signal from the -E2 system flip-flop circuit 2 reaches a level close to the ground voltage GND after a lapse of a transition time D1 from when the inverted signal IN1 goes to the ground voltage GND, the P-channel MOSFET P14 turns off and the N-channel MOSFET N14 turns on. At this time, the inverted signal IN1 of the ground voltage GND has been already supplied to the gate electrodes of the P-channel MOSFET P15 and the N-channel MOSFET N15, with the result that the P-channel MOSFET P15 has been off and the N-channel MOSFET N15 has been on. This places the output signal OUT2 at the second voltage -E2. In this embodiment, unlike the conventional .interface circuit, since the inverted signal IN1 whose potential changes earlier than the potential at the point A is supplied to the gate of the P-channel MOSFET P15 to turns off it, a period of time when all the MOSFETs in the -E2 system inverter circuit 3a turn on simultaneously is eliminated. As a result, the through current will not flow in the -E2 system inverter circuit 3a as shown in FIG. 3(f).

Figure 7:
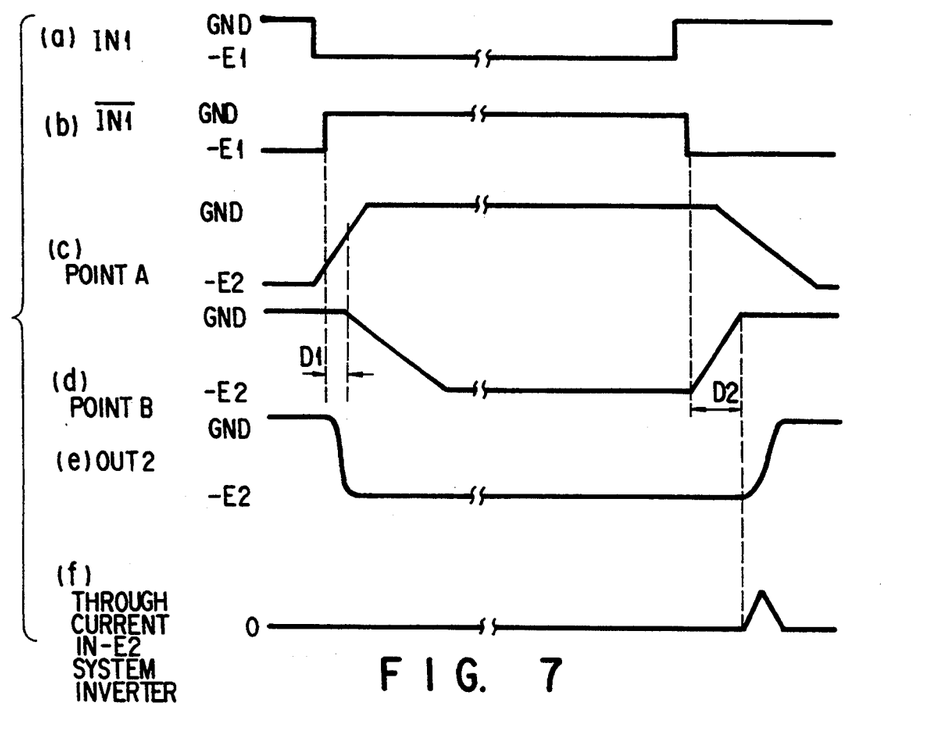
FIG. 7 is a timing chart for the operation of the interface circuit of FIG. 6.

Next, when the input signal IN1 changes from the first voltage -E1 to the ground voltage GND, as shown in FIG. 7(a), the interface circuit of FIG. 6 operates as the conventional interface circuit does in FIG. 3 (except for FIG. 3(f)). When the input signal IN1 changes to the ground voltage GND, the inverter signal IN1 changes to the first voltage -E1. Thus the N-channel MOSFET N15 changes from low resistance ON to high resistance on. A and B operate similarly to the conventional example of FIG. 3. Thus, when the potential at the point A goes to a level close to the second voltage -E2, the N-channel MOSFET N14 turns off and the P-channel MOSFET P14 turns on. At this time, because the P-channel MOSFET P15 is also ON, placing the potential of the output signal OUT2 to the ground voltage GND. In this case, the N-channel MOSFET N15 operates as follows. When the inverted signal IN1 is at the ground voltage GND, its gate bias is at a high potential of |(-E2)−GND|. When the inverted signal IN1 is at the first voltage -E1, the gate bias is at |(-E2)−(-E1)|, and its amplification factor gm becomes smaller. Although there is a period of time when all the MOSFETs in the -E2 system logic circuit 3a turn on simultaneously, because the gate potential of the N-channel MOSFET N15, whose gate receives the inverted signal IN1 whose potential changes earlier than the potential at the point A, changes from the ground voltage GND to the first voltage -E1, resulting in an increase in the on resistance, the through current in the -E2 system inverter circuit 3a occurs with a delay time D2 from when the inverted signal IN1 changes from the ground voltage GND to the first voltage -E1, but decreases as shown in FIG. 7(f).

Figure 8:
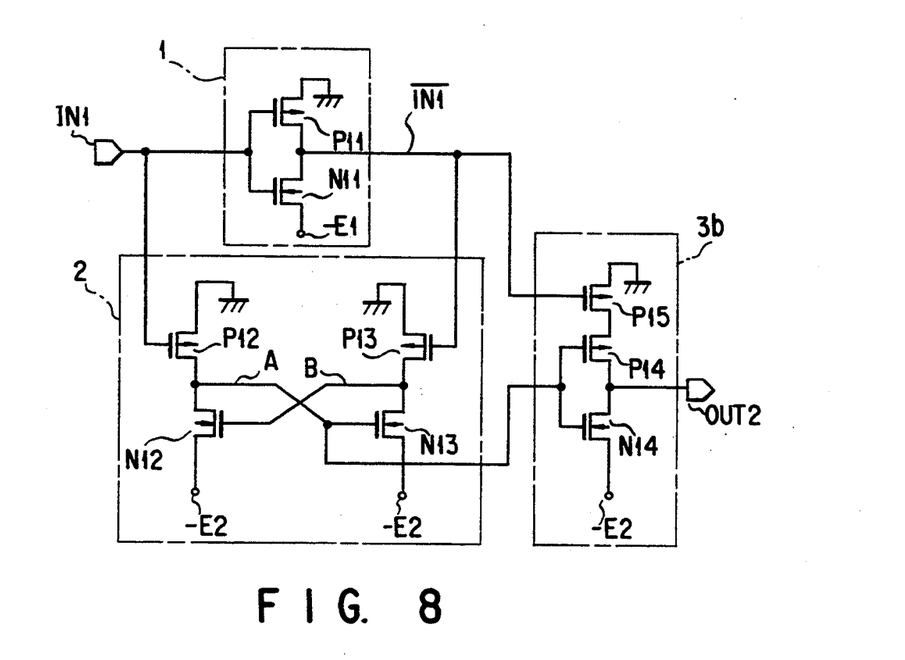
FIG. 8 is a circuit diagram of an interface circuit according to a second embodiment of the present invention.

FIG. 8 is a circuit diagram of an interface circuit according to a second embodiment of the present invention. The interface circuit of FIG. 8 differs from the interface circuit of FIG. 6 in configuration in the following points. The -E2 system inverter circuit 3b of FIG. 8 is composed of P-channel MOSFETs P15 and P14 and an N-channel MOSFET N14 and is obtained by eliminating the N-channel MOSFET N15 using the inverted signal IN1 as the gate input, from the interface circuit of FIG. 6. Because the remaining parts are the same as those in the FIG. 6 interface circuit, the same parts are indicated by the same reference characters and their explanation will be omitted. The interface circuit of FIG. 8 operates as shown in FIG. 7 when the potential of the input signal IN1 changes from the ground voltage GND to the first voltage -E1. When the potential of the input signal IN1 changes from the first voltage -E1 to the ground voltage GND, it operates as shown in FIG. 3. As described in FIG. 7, when the input signal IN1 changes from the ground voltage GND to the first voltage -E1, the through current will not flow in the -E2 system inverter circuit 3b.

Figure 9:
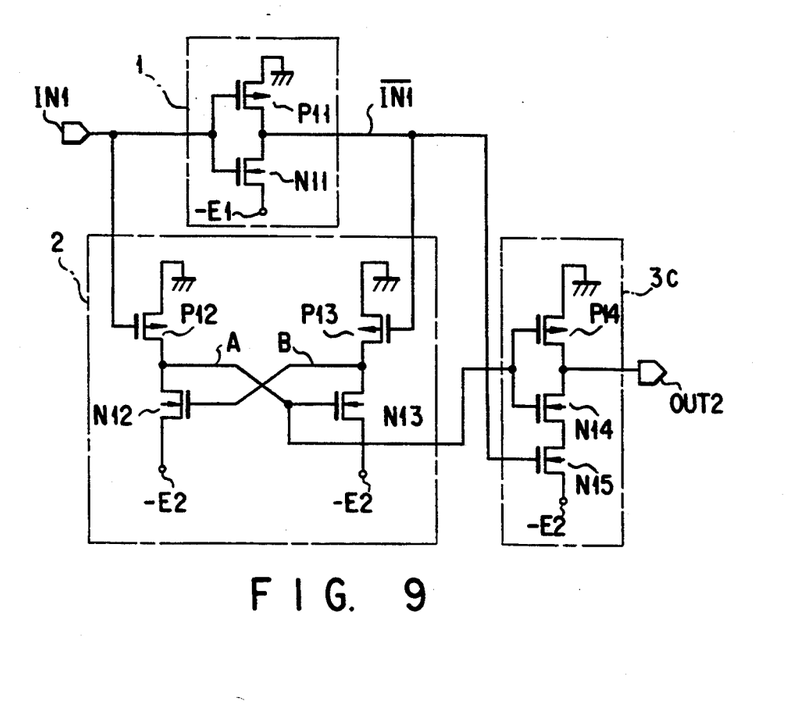
FIG. 9 is a circuit diagram of an interface circuit according to a third embodiment of the present invention.

FIG. 9 is a circuit diagram of an interface circuit according to a third embodiment of the present invention. The interface circuit of FIG. 9 differs from the interface circuit of FIG. 6 in configuration in the following points. The -E2 system inverter circuit 3c of FIG. 9 is composed of a P-channel MOSFET P14 and N-channel MOSFETs N14 and N15, and is obtained by eliminating the P-channel MOSFET N15 using the inverted signal IN1 as the gate input, from the -E2 system inverter circuit 3a of the interface circuit of FIG. 6. Because the remaining parts are the same as those in the FIG. 6 interface circuit, the same parts are indicated by the same reference characters and their explanation will be omitted. The interface circuit of FIG. 9 operates as shown in FIG. 3 when the potential of the input signal IN1 changes from the ground voltage GND to the first voltage -E1. When the potential of the input signal IN1 changes from the first voltage -E1 to the ground voltage GND, it operates as shown in FIG. 7. As described in FIG. 7, with the interface circuit of FIG. 9, the through current that flows when the input signal IN1 changes from the first voltage -E1 to the ground voltage GND, can be decreased as compared with the conventional interface circuit.

Figure 10:
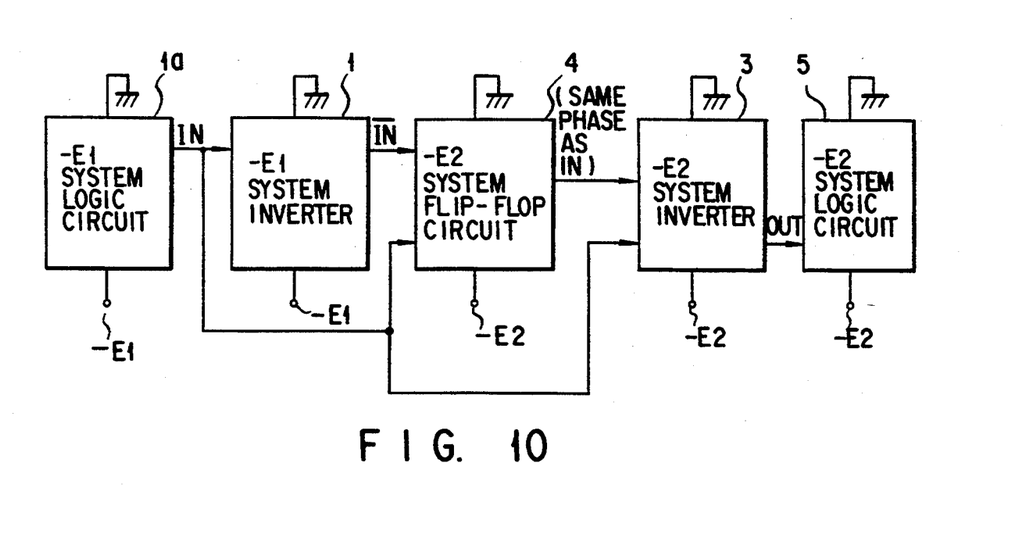
FIG. 10 is another schematic block diagram of an interface circuit of the present invention.

FIG. 10 is another schematic block diagram of an interface circuit of the present invention. The interface circuit of FIG. 10 differs from the interface circuit of FIG. 5 in the following two points. First, while the output of the -E1 system logic circuit 1a in the interface circuit of FIG. 5 is supplied to the -E1 system inverter circuit 1 and the -E2 system flip-flop circuit 2, the output signal of the -E1 system 1a in the interface circuit of FIG. 10 is supplied to the -E1 system inverter circuit 1, the -E2 system flip-flop circuit 4, and the -E2 system inverter circuit 3. Second, while the output signal of the -E1 system inverter circuit 1 in the interface circuit of FIG. 5 is supplied to the -E2 system flip-flop circuit 2 and the -E2 system inverter circuit 3, the output signal IN of the -E1 system inverter circuit 1 in the interface circuit of FIG. 10 is supplied to the -E2 system flip-flop circuit 4 only. Because the remaining parts are the same as those in the FIG. 5 interface circuit, the same parts are indicated by the same reference characters and their explanation will be omitted. Although, in the interface circuit of FIG. 5, the output signal directly supplied from the -E2 system flip-flop circuit 2 to the -E2 system logic circuit 3, is in an opposite phase to the input signal IN, in the interface circuit of FIG. 10, a signal having the same phase as the input signal IN is supplied to the -E2 system logic circuit.

Figure 11:
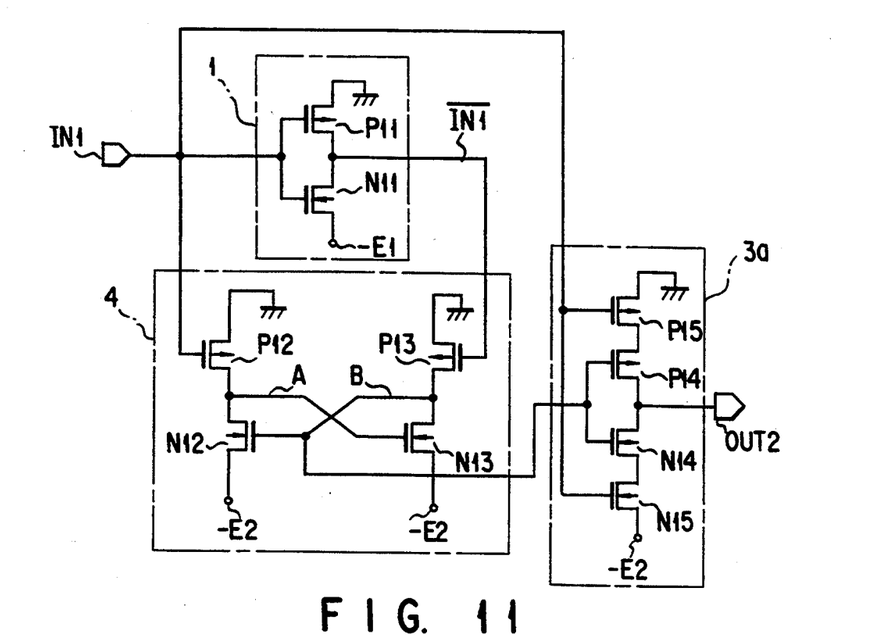
FIG. 11 is a circuit diagram of an interface circuit according to a fourth embodiment of the present invention.

Referring to FIG. 11, an interface circuit according to a fourth embodiment of the present invention will be explained. The interface circuit of FIG. 11 differs from the interface circuit of FIG. 6 in the following two points. First, while the inverted signal in the interface circuit of FIG. 6 is supplied as inputs to the gates of the P-channel MOSFET P15 and the N-channel MOSFET N15, the signal IN1 in the interface circuit of FIG. 11 is supplied as inputs to the gates of the P-channel MOSFET P15 and the N-channel MOSFET N15. Second, while, in the interface circuit of FIG. 6, the output signal at the connection of the other end of the current path of the P-channel MOSFET P12 and one end of the current path of the N-channel MOSFET N12 is used as the output signal of the -E2 system flip-flop circuit 2, in the interface circuit of FIG. 11, the output signal at the connection of the other end of the current path of the P-channel MOSFET P13 and one end of the current path of the N-channel MOSFET N13 is used as the output signal of the -E2 system flip-flop circuit 4. Because the remaining parts of the FIG. 11 interface circuit are the same as those in the FIG. 6 interface circuit, the same parts are indicated by the same reference characters and their explanation will be omitted.

With reference to the timing chart of FIG. 12, the operation of an interface circuit associated with the fourth embodiment will be described. When the input signal IN1 is at the ground voltage GND, the P-channel MOSFET P12 is OFF, the inverted signal IN1 is at the first voltage -E1 (FIG. 12(b)), the P-channel MOSFET P13 is ON, the potential at the point B is at the ground voltage GND, the potential at the point A is at the second voltage -E2, the P-channel MOSFET P14 is OFF, the N-channel MOSFET N14 is ON, the P-channel MOSFET P15 is OFF, and the N-channel MOSFET N15 is ON. Thus, the output signal OUT2 of the -E2 system logic circuit 3a is at the second voltage -E2 as shown in FIG. 12(e).

Figure 12:
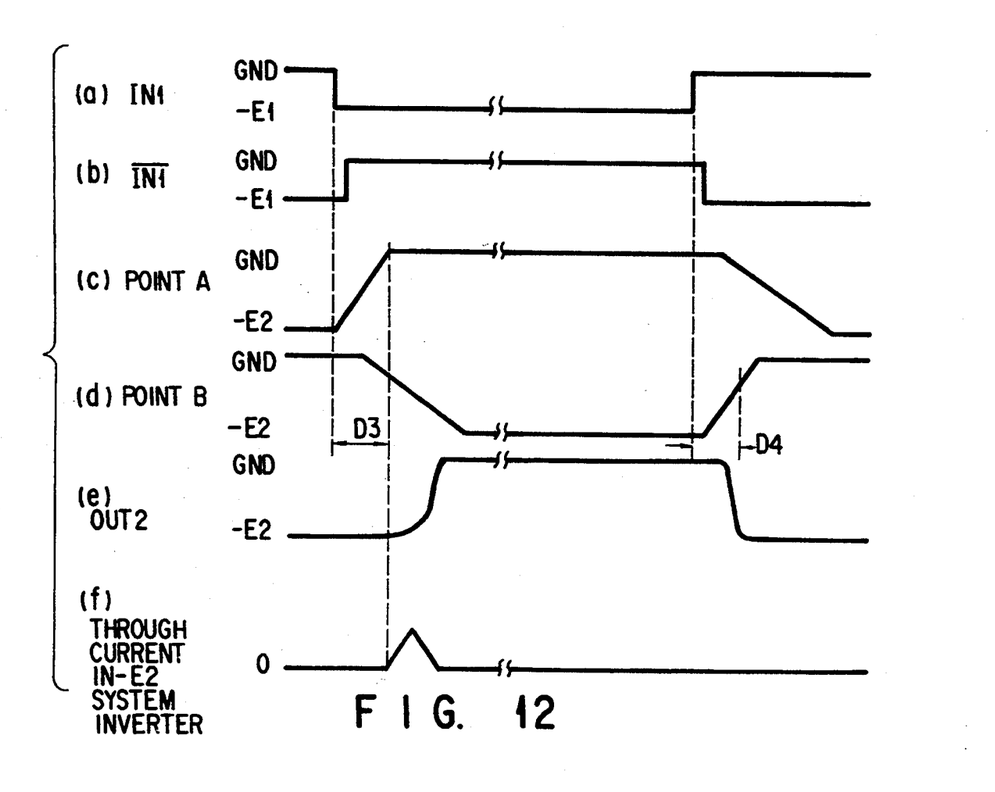
FIG. 12 is a timing chart for the operation of the interface circuit of FIG. 11.

When the input signal IN1 changes from the ground voltage GND to the first voltage -E1 as shown in FIG. 12, the P-channel MOSFET P15 turns on and the N-channel MOSFET N15 turns on with a high resistance. At this time, points A and B operate similarly to those in the conventional circuit of FIG. 3. When the potential at the point B goes to a level equal or close to the second voltage -E2, the N-channel MOSFET N14 turns off and the P-channel MOSFET P14 turns on. At this time, because the P-channel MOSFET P15 has received the input signal IN1 of the first voltage -E1 and is ON, the potential of the output signal OUT 2 goes to the ground voltage GND, as shown in FIG. 12(e). As a result, there arises a period of time when all the MOSFETs in the -E2 system logic circuit 3a of FIG. 11 turn on simultaneously, causing a through current. However, because the gate potential of the N-channel MOSFET N15, whose gate receives the input signal IN1 whose potential changes earlier than the potential at the point B, changes from the ground voltage GND to the first voltage -E1, the ON resistance is increased. As a result, the through current in the -E2 system logic circuit 3a flows with a delay time D3 from when the input signal IN1 changes from the ground voltage GND to the first voltage -E1, but decreases as shown in FIG. 12(f), as compared with the conventional equivalent.

Then, when the input signal IN1 changes from the first voltage -E1 to the ground voltage GND as shown in FIG. 12, the interface circuit of FIG. 11 operates similarly to the interface circuit of FIG. 4 according to the timing chart of FIG. 3 (except for FIG. 3(f)). When the input signal IN1 changes to the ground voltage GND, the N-channel MOSFET N15 changes from high resistance ON to low resistance ON, and the P-channel MOSFET P15 is turned off. At this time, points A and B operate similarly to those in the conventional circuit of FIG. 3. When the potential at the point B goes to a value close to the ground voltage GND after a lapse of a transition time D4 from when the input signal IN1 goes to the ground voltage GND, the P-channel MOSFET P14 turns off and the N-channel MOSFET N14 turns on. At this time, because the N-channel MOSFET N15 is also ON, the potential of the output signal OUT2 also goes to the second voltage -E2. Specifically, when the interface circuit of FIG. 11 operates as shown in FIG. 12, the P-channel MOSFET P15, whose gate receives the input signal IN1 whose potential changes earlier than the potential at the point B, turns off. This eliminates the period of time when all the MOSFETs in the -E2 system logic circuit 3a turn on simultaneously, resulting in no through current in the -E2 system logic circuit 3a as shown in FIG. 12(f).

Figure 13:
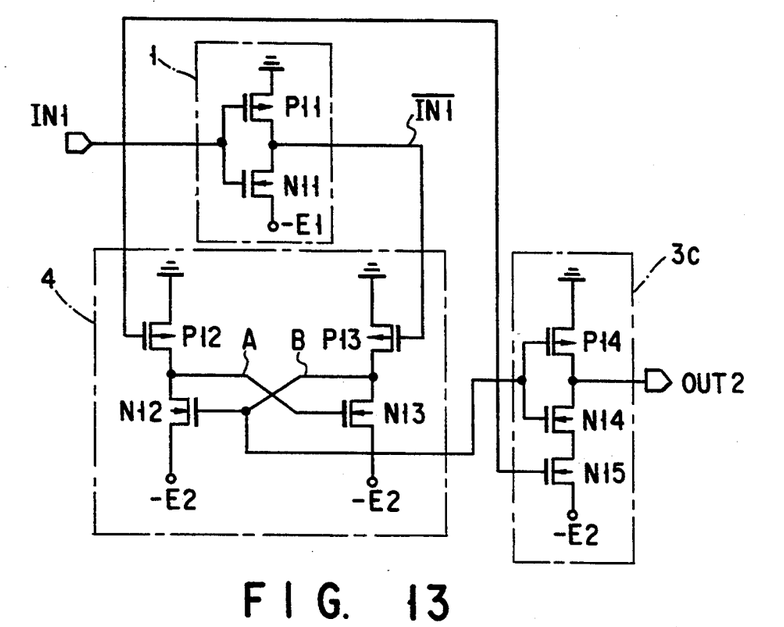
FIG. 13 is a circuit diagram of an interface circuit according to a fifth embodiment of the present invention.

An interface circuit according to a fifth embodiment of the present invention shown in FIG. 13 will be described. The interface circuit of FIG. 13 differs from the interface circuit of FIG. 11 in the following points. The interface circuit of FIG. 13 is obtained by eliminating the P-channel MOSFET P15 using the signal IN1 as the gate input, from the -E2 system logic circuit 3a. Because the remaining parts are the same as those in the FIG. 11 interface circuit, the same parts are indicated by the same reference characters and their explanation will be omitted. With the interface circuit of FIG. 13, when the input signal IN1 changes from the ground voltage GND to the first voltage -E1, a through current occurs. However, because the gate potential of the N-channel MOSFET N15, whose gate receives the input signal IN1 whose potential changes earlier than the potential at the point B, changes from the ground voltage GND to the first voltage -E1, the ON resistance is increased. Consequently, the through current is decreased as compared with the conventional equivalent.

Figure 14:
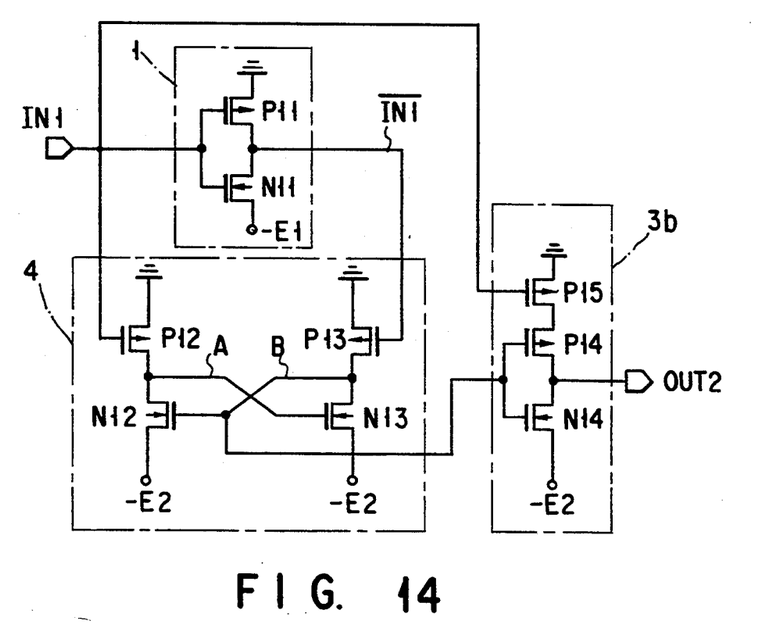
FIG. 14 is a circuit diagram of an interface circuit according to a sixth embodiment of the present invention.

With reference to FIG. 14, an interface circuit according to a sixth embodiment of the present invention will be described. The interface circuit of FIG. 14 differs from the interface circuit of FIG. 11 in the following points. The -E2 system inverter circuit 3b of FIG. 14 is obtained by eliminating the N-channel MOSFET N15 using the signal IN1 as the gate input, from the -E2 system inverter circuit 3a of FIG. 11. Because the remaining parts are the same as those in the FIG. 11 interface circuit, the same parts are indicated by the same reference characters and their explanation will be omitted. The interface circuit of FIG. 14 thus constructed operates similarly to the interface circuit of FIG. 11. This results in no through current when the input signal IN1 changes from the first voltage -E1 to the ground voltage GND, as in FIG. 12. With the interface circuit of this embodiment, the circuit operation can be stabilized without impairing the level output of the -E2 system logic circuit.

With the present invention, the through current in the second inverter circuit can be reduced by supplying the inverted signal, i.e., the output signal of the first inverter circuit, to the second inverter circuit earlier than a high-potential signal, i.e., the output of the high-potential-system power supply flip-flop circuit. Further, with the present invention, the through current in the second inverter circuit can be reduced by supplying a low-potential signal to the second inverter circuit earlier than a high-potential signal, i.e., the output of the high-potential system power supply flip-flop circuit.

Additional advantages and modifications will readily occur to those skilled in the art. Therefore, the invention in its broader aspects is not limited to the specific details, and representative devices, shown described herein. Accordingly, various modifications may be made without departing from the spirit or scope of the general inventive concept as defined by the appended claims and their equivalents.

What is claimed is:

1. An interface circuit comprising:
   an output circuit for outputting a low-potential signal;
   a first inverter circuit, connected between a low-potential power supply and a ground potential power supply, for inverting said low-potential signal input from said output circuit and outputting a low-potential inverted signal;
   a high-potential system power supply flip-flop circuit, connected between a high-potential power supply and said ground potential power supply, for outputting a high-potential signal having an opposite phase to said low-potential signal with a predetermined transition time by using said low-potential signal input from said output circuit and said low-potential inverted signal input from said first inverter circuit; and
   a second inverter circuit including a first transistor of a first conductivity-type, a first transistor of a second conductivity-type and at least one second transistor of either conductivity-type which are connected serially between said high-potential power supply and said ground potential power supply, and for outputting a high-potential signal having an opposite phase to said high-potential signal output from said high-potential system power supply flip-flop circuit from a connection point as an output terminal between said first transistor of said first conductivity-type and said first transistor of said second conductivity-type by using said low-potential inverted signal of said first inverter circuit which is input to a gate of said second transistor of either conductivity-type and said high-potential signal having said opposite phase which is input to gates of said first transistors of said first and said second conductivity-type.

2. An interface circuit according to claim 1, wherein said first transistor of said first conductivity-type is connected between said output terminal and said ground potential power supply, and said first transistor of said second conductivity-type and said second transistor of a second conductivity-type are connected serially between said output terminal and said high-potential power supply.

3. An interface circuit according to claim 1, wherein said first transistor of said first conductivity-type and said second transistor of a first conductivity-type are connected serially between said output terminal and said ground potential power supply, and said first transistor of said second conductivity-type is connected between said output terminal and said high-potential power supply.

4. An interface circuit according to claim 1, wherein said first transistor of said first conductivity-type and said second transistor of a first conductivity-type are connected serially between said output terminal and said ground potential power supply, and said first transistor of said second conductivity-type and said second transistor of a second conductivity-type are connected serially between said output terminal and said high-potential power supply.

5. An interface circuit comprising:
   an output circuit for outputting a low-potential signal;
   a first inverter circuit, connected between a low-potential power supply and a ground potential power supply, for inverting said low-potential signal input from said output circuit and outputting a low-potential inverted signal;
   a high-potential system power supply flip-flop circuit, connected between a high-potential power supply and said ground potential power supply, for outputting a high-potential signal having the same phase as said low-potential signal with a predetermined transition time by using said low-potential signal input from said output circuit and said low-potential inverted signal input from said first inverter circuit; and
   a second inverter circuit including a first transistor of a first conductivity-type, a first transistor of a second conductivity-type and at least one second transistor of either conductivity-type which are connected serially between said high-potential power supply and said ground potential power supply, and for outputting a high-potential signal having an opposite phase to said high-potential signal output from said high-potential system power supply flip-flop circuit from a connection point as an output terminal between said first transistor of said first conductivity-type and said first transistor of said second conductivity-type by using said low-potential signal of said output circuit which is input to a gate of said second transistor of either conductivity-type and said high-potential signal having said same phase which is input to gates of said first transistors of said first and said second conductivity-type.

6. An interface circuit according to claim 5, wherein said first transistor of said first conductivity-type is connected between said output terminal and said ground potential power supply, and said first transistor of said second conductivity-type and said second transistor of a second conductivity-type are connected serially between said output terminal and said high-potential power supply.

7. An interface circuit according to claim 5, wherein said first transistor of said first conductivity-type and said second transistor of a first conductivity-type are connected serially between said output terminal and said ground potential power supply, and said first transistor of said second conductivity-type is connected between said output terminal and said high-potential power supply.

8. An interface circuit according to claim 5, wherein said first transistor of said first conductivity-type and said second transistor of a first conductivity-type are connected serially between said output terminal and said ground potential power supply, and said first transistor of said second conductivity-type and said second transistor of a second conductivity-type are connected serially between said output terminal and said high-potential power supply.

* * * * *